United States Patent
Hou et al.

(10) Patent No.: US 11,140,776 B2
(45) Date of Patent: Oct. 5, 2021

(54) METHOD OF MAKING A RIGID/FLEX CIRCUIT BOARD

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Ning Hou, Shenzhen (CN); Wei-Xiang Li, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/713,337

(22) Filed: Dec. 13, 2019

(65) Prior Publication Data

US 2020/0154559 A1    May 14, 2020

Related U.S. Application Data

(63) Continuation-in-part of application No. PCT/CN2018/114914, filed on Nov. 9, 2018.

(51) Int. Cl.
*H05K 1/02* (2006.01)
*H05K 3/46* (2006.01)
(Continued)

(52) U.S. Cl.
CPC ............ *H05K 1/028* (2013.01); *H05K 3/06* (2013.01); *H05K 3/22* (2013.01); *H05K 3/4652* (2013.01);
(Continued)

(58) Field of Classification Search
CPC ............ H05K 1/28; H05K 3/027; H05K 3/06; H05K 3/22; H05K 3/4652; H05K 3/4691; H05K 2201/058
See application file for complete search history.

(56) References Cited

U.S. PATENT DOCUMENTS

| | | | |
|---|---|---|---|
| 9,743,533 B2 * | 8/2017 | Tsai | H05K 3/4691 |
| 2006/0169485 A1 * | 8/2006 | Kawaguchi | H05K 3/4691 174/254 |
| 2008/0289859 A1 * | 11/2008 | Mikado | H05K 1/0281 174/254 |

FOREIGN PATENT DOCUMENTS

| | | |
|---|---|---|
| CN | 106332438 | 1/2017 |
| CN | 106332438 A * | 1/2017 |

(Continued)

*Primary Examiner* — Carl J Arbes
(74) *Attorney, Agent, or Firm* — ScienBiziP, P.C.

(57) ABSTRACT

Manufacturing a rigid-flex circuit board includes providing an inner flexible circuit board and a first flexible metal clad laminate, laminating the first flexible metal clad laminate on a surface of the inner flexible circuit board through a first adhesive film, causing the first copper layer to form a third conductive circuit layer, partially covering the metal protective layer exposed by the third conductive circuit layer, removing the metal protective layer exposed by the third conductive circuit layer and the covered area, providing a second copper foil, laminating the second copper foil on a surface of the third conductive circuit layer through a second adhesive film, removing the metal protective layer at the opening area, and causing the second copper foil to form a fifth conductive circuit layer. The first flexible metal clad laminate includes a second base material layer, a metal protective layer, and a first copper layer.

6 Claims, 4 Drawing Sheets

(51) Int. Cl.
 H05K 3/22 (2006.01)
 H05K 3/06 (2006.01)
 H05K 3/02 (2006.01)
(52) U.S. Cl.
 CPC ....... *H05K 3/027* (2013.01); *H05K 2201/058* (2013.01)

(56) References Cited

FOREIGN PATENT DOCUMENTS

| | | | | |
|---|---|---|---|---|
| JP | 2006216593 | A | * | 8/2006 |
| JP | 2010040934 | A | * | 2/2010 |

* cited by examiner

METHOD OF MAKING A RIGID/FLEX CIRCUIT BOARD

FIELD

The invention relates to a circuit board and a manufacturing method thereof, in particular to a rigid-flex circuit board and a manufacturing method thereof.

BACKGROUND

In recent years, electronic products have been widely used in daily work and life. The combination of soft and hard boards is relatively thin and flexible, and has the advantages of thin, light, easy assembly, electrical signal transmission, and better product reliability. As the demand for quality and lightness and thinness of consumer electronics products becomes more stringent, the proportion of circuit board conversion to soft and hard board design is increasing. Conventional soft and hard bonding boards or multi-layer FPC products that need to be opened are usually covered with a layer of CVL to protect the inner layer in the open area, but this will increase the process of CVL punching, pasting, pressing, baking, etc. The production cost is increased, and the polyimide (PI) material exposed in the open area is poor in compactness when the carbon or copper is metalized during shadow processing, which may cause the copper skin to be damaged.

SUMMARY OF THE INVENTION

In view of the above, it is necessary to provide a method of fabricating a rigid-flex circuit board that can solve the above problems.

A rigid-flex circuit board produced by the above manufacturing method is also provided.

A method for manufacturing a rigid-flex circuit board, comprising the following steps: providing a inner flexible circuit board and a first flexible metal clad laminate, and laminating the first flexible metal clad laminate on a surface of the inner flexible circuit board through a first adhesive film, wherein the first flexible metal clad laminate comprises a second base material layer laminated on a surface of the first adhesive film, a metal protective layer formed on a surface of the second base material layer, and a first copper layer formed on a surface of the metal protective layer; causing the first copper layer to form a third conductive circuit layer; partially covering the metal protective layer exposed by the third conductive circuit layer, and removing the metal protective layer exposed by the third conductive circuit layer and the covered area; providing a second copper foil, and laminating the second copper foil on a surface of the third conductive circuit layer through a second adhesive film, wherein the second copper foil and the second adhesive film go through a pre-opening window processing to form a opening area, the opening area located at the remaining metal protective layer; removing the metal protective layer at the opening area; and causing the second copper foil to form a fifth conductive circuit layer.

A rigid-flex circuit board, comprising: a inner flexible circuit board; a first adhesive film bonded to a surface of the inner flexible circuit board; a first flexible metal clad laminate bonded to a he surface of the first adhesive film, the first flexible metal clad laminate comprises a second base material layer laminated on a surface of the first adhesive film, a metal protective layer formed on a surface of the second base material layer, and a third conductive circuit layer formed on a surface of the metal protective layer; a second adhesive film bonded on an outer side of the third conductive circuit layer; and a fifth conductive circuit layer bonded on an outer side of the second adhesive film; the rigid-flex circuit board comprises a opening area, wherein the metal protective layer, the third conductive circuit layer, the second adhesive film, and the fifth conductive circuit layer are removed at the opening area.

The rigid-flex circuit board provided by the present invention protects the second base material layer at the opening area by the metal protective layer during the shadow processing, and then removes the metal protective layer, so that the second base material layer is intact, which can solve the bad issues of carbon and copper causing damage on the second base material layer after shadow processing, and the circuit layer at the opening area can be effectively protected. Simultaneously, the metal protective layer serves as a seed layer, which can enhance a copper effect of the first copper layer on the second base material layer. Compared with the traditional applying the cover layer (CVL) in the open cover area and then removing, it reduces processes and improves efficiency.

| ELEMENT LISTING | |
|---|---|
| Rigid-flex circuit board | 100 |
| Inner flexible circuit board | 10 |
| First base layer | 11 |
| First conductive circuit layer | 13 |
| Second conductive circuit layer | 15 |
| First flexible metal clad laminate | 20 |
| Second base material layer | 21 |
| Metal protective layer | 23 |
| First copper layer | 25 |
| Third conductive circuit layer | 251 |

-continued

| ELEMENT LISTING | |
|---|---|
| Fourth conductive circuit layer | 253 |
| First receiving hole | 26 |
| First adhesive film | 30 |
| First through hole | 40 |
| Dry film | 50 |
| Second copper foil | 60 |
| Fifth conductive circuit layer | 61 |
| Second receiving hole | 62 |
| Sixth conductive line layer | 63 |
| Second adhesive film | 70 |
| Metal protective layer | 80 |
| Opening area | 101 |

The invention will be further illustrated by the following detailed description in conjunction with the accompanying drawings.

DETAILED DESCRIPTION

The technical solutions in the embodiments of the present invention are clearly and completely described in the following with reference to the accompanying drawings in the embodiments of the present invention. It is obvious that the described embodiments are only a part of the embodiments of the present invention, and not all of the embodiments. All other embodiments obtained by those skilled in the art based on the embodiments of the present invention without creative efforts are within the scope of the present invention.

Unless otherwise defined, all technical and scientific terms used herein have the same meaning as those understood by the common worker in the art. The terminology used in the description of the present invention is for the purpose of describing particular embodiments and is not intended to limit the invention.

Some embodiments of the present invention are described in detail below with reference to the accompanying drawings. The features of the embodiments and examples described below can be combined with each other without conflict.

Figure 1:
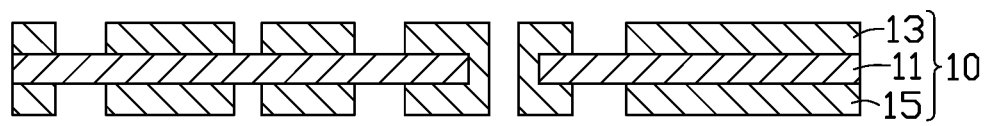
FIG. 1 is a schematic cross-sectional view showing a inner flexible circuit board according to an embodiment of the present invention.

Referring to FIG. 1 to FIG. 9, a method for fabricating a rigid-flex circuit board 100 according to an embodiment of the present invention includes the following steps:

Step S1, referring to FIG. 1, a inner flexible circuit board 10 is provided. The inner flexible circuit board 10 includes a flexible first base layer 11 and a first conductive circuit layer 13 and a second conductive circuit layer 15 respectively formed on opposite surfaces of the first base layer 11 and electrically connected together.

The material of the first base layer 11 may be one selected from the group consisting of polyimide (PI), liquid crystal polymer (LCP), polyetheretherketone (PEEK), polyethylene terephthalate, polyethylene terephthalate (PET), and polyethylene naphthalate (PEN).

The first conductive circuit layer 13 and the second conductive circuit layer 15 are formed by two copper layers formed on opposite surfaces of the first base layer 11 subjected to drilling, copper plating, etching, lamination, exposure, and film removal processes (Developing Etching Stripping, DES).

Figure 2:
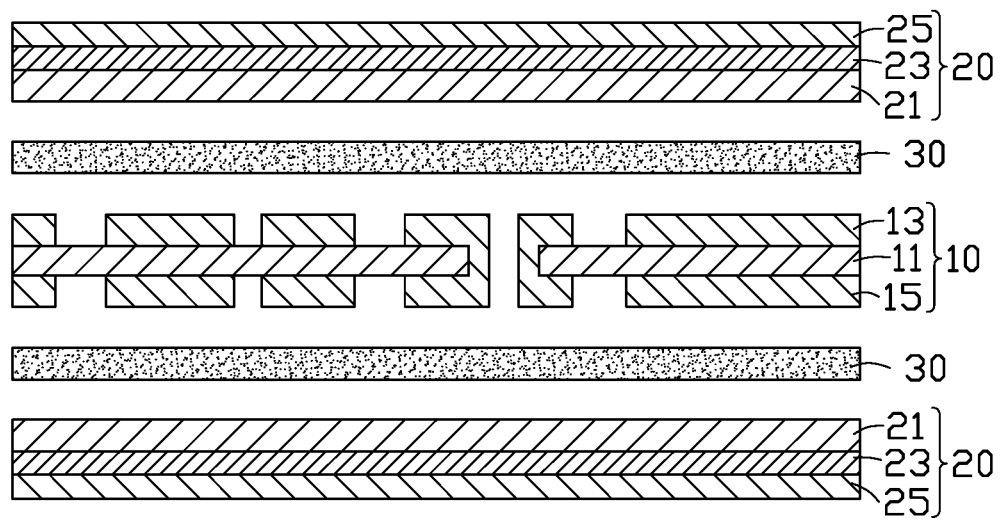
FIG. 2 is a cross-sectional view showing the first flexible metal clad laminate laminated on the inner flexible circuit board shown in FIG. 1.

Step S2, referring to FIG. 2, two first flexible metal clad laminates 20 are provided, and the two first flexible metal clad laminates 20 are respectively laminated onto the two surfaces of the inner flexible circuit board 10 through two first adhesive films 30.

The first flexible metal clad laminate 20 includes a flexible second base material layer 21 laminated against the surface of the first adhesive film 30, a metal protective layer 23 formed on the surface of the second base material layer 21, and a first copper layer 25 formed on the surface of the metal protective layer 23.

In the present embodiment, the first adhesive film 30 directly laminates the first flexible metal clad laminate 20 onto both surfaces of the inner flexible circuit board 10, but is not limited thereto. In other embodiments, the first adhesive film 30 may also laminate the second base material layer 21 only on both surfaces of the inner flexible circuit board 10, then the metal protective layer 23 may be formed by sputtering or the like on the second base material layer 21, and finally the first copper layer 25 is formed on a surface of the metal protective layer 23.

The material of the second base material layer 21 may be one selected from the group consisting of polyimide (PI), liquid crystal polymer (LCP), polyetheretherketone (PEEK), polyethylene terephthalate (PET), and polyethylene naphthalate (PEN). In this embodiment, the material of the second base material layer 21 is the same as the material of the first base layer 11.

In the present embodiment, the material of the metal protective layer 23 is Ni/Cr or Ti. The material of the metal protective layer 23 may be selected from Cu, Ag, Al, Zn, Sn, Fe, etc., as long as it is a material capable of forming a metal protective layer on the surface of the second base material layer 21 by sputtering.

In this embodiment, the material of the first adhesive film 30 is a resin having viscosity. More specifically, the resin may be at least one selected from the group consisting of polypropylene, epoxy resin, polyurethane, phenolic resin, urea-formaldehyde resin, melamine-formaldehyde resin, and polyimide.

Figure 3:
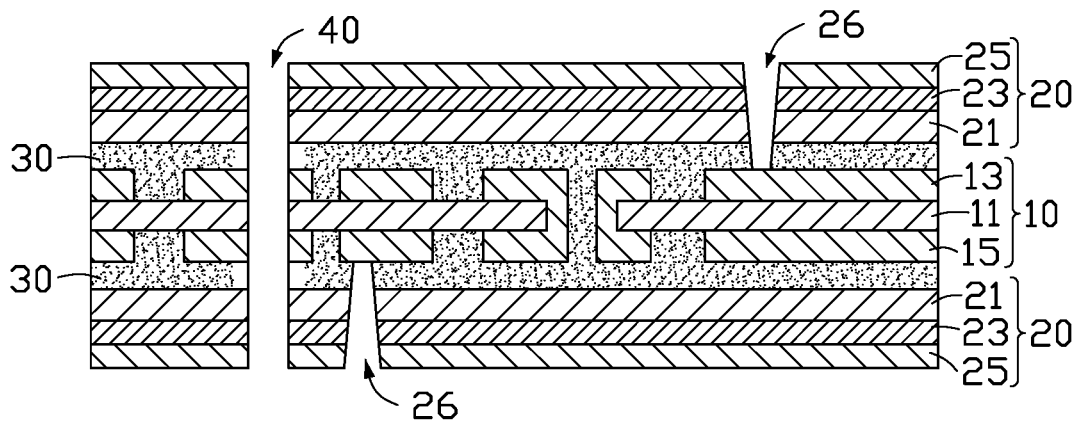
FIG. 3 is a cross-sectional view showing an opening in the inner flexible circuit board and the first flexible metal clad laminate shown in FIG. 2.

Step S3, referring to FIG. 3, the inner flexible circuit board 10 and the first flexible metal clad laminates 20 are subjected to an opening process, and a first through hole 40 is opened in a stacking direction of the first flexible metal clad laminate 20, the first adhesive film 30, and the inner flexible circuit board 10. A plurality of first receiving holes 26 is opened in the first flexible metal clad laminates 20. The first through hole 40 extends through the two first flexible metal clad laminates 20, the two first adhesive films 30, and the inner flexible circuit board 10. The first receiving hole 26 is a blind hole that penetrates the first flexible metal clad laminate 20 and the first adhesive film 30 and exposes the inner flexible circuit board 10.

In the embodiment, the first through hole 40 and the at least two first receiving holes 26 are formed by a laser. In other embodiments, the first through hole 40 and the at least two first receiving holes 26 may be formed by other means such as mechanical drilling, stamping, and the like.

Figure 4:
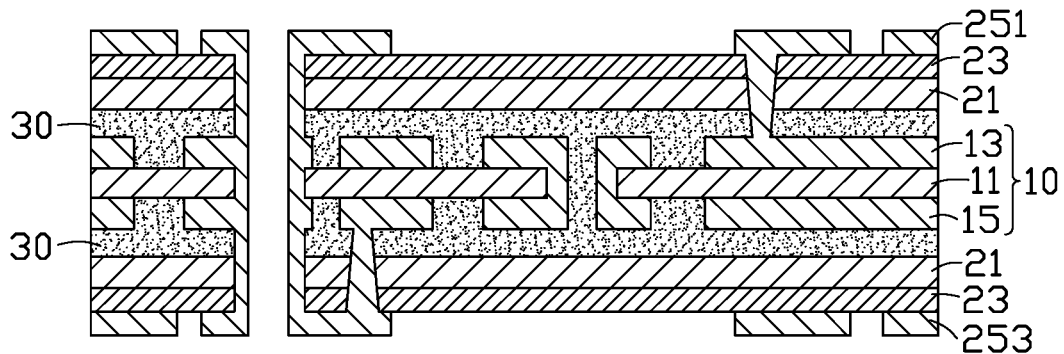
FIG. 4 is a schematic cross-sectional view showing the electroplating, filling, and etching of the opening in FIG. 3.

Step S4, referring to FIG. 4, the inner flexible circuit board 10 and the first flexible metal clad laminates 20 are subjected to electroplating, etching, pressing, exposing, and stripping processes (Developping Etching Stripping, DES) process, so that the third conductive circuit layer 251 and the fourth conductive circuit layer 253 are formed by etching on the two first copper layers 25 on the two first flexible metal clad laminates 20, respectively, and the first conductive circuit layer 13, the second conductive circuit layer 15, the third conductive circuit layer 251, and the fourth conductive circuit layer 253 are electrically connected to each other, and simultaneously the third conductive circuit layer 251 and the fourth conductive circuit layer 253 are respectively connected to the first conductive circuit layer 13 or the second conductive circuit layer 15.

Figure 5:
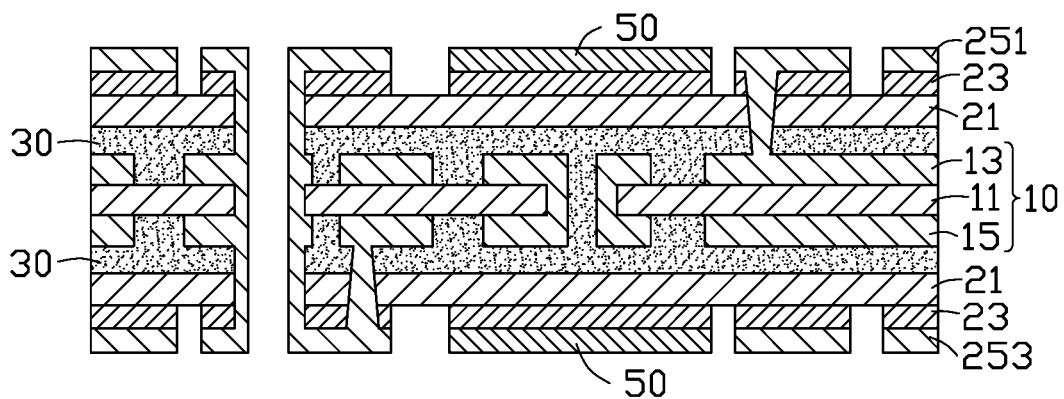
FIG. 5 is a cross-sectional view showing the removal of an exposed metal protective layer shown in FIG. 4.

Step S5, referring to FIG. 5, the metal protective layer 23 exposed by the third conductive circuit layer 251 and the fourth conductive circuit layer 253 is partially covered by a dry film 50, and the remaining exposed portions of the metal protective layer 23 exposed by the third conductive circuit layer 251 and the fourth conductive circuit layer 253 are removed, and then the dry film 50 is removed.

In the present embodiment, the dry film 50 is a peelable film.

In the present embodiment, the remaining exposed portions of the metal protective layer 23 are removed by etching.

Figure 6:
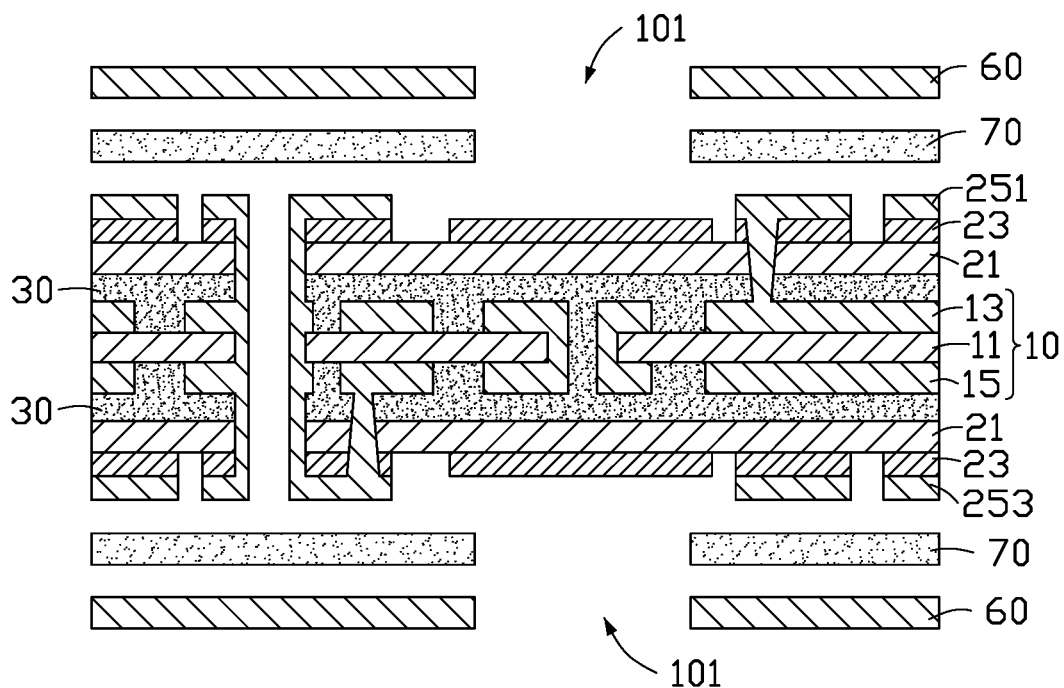
FIG. 6 is a cross-sectional view showing a semi-finished product of the rigid-flex circuit board in which a second copper foil is laminated on the inner flexible circuit board and the first flexible metal clad laminate shown in FIG. 5.

Step S6, referring to FIG. 6, two second copper foils 60 are provided, and the two second copper foils 60 are respectively laminated on a surface of the third conductive circuit layer 251 and the fourth conductive circuit layer 253 through two second adhesive films 70 to form a semi-finished product of the rigid-flex circuit board 100. The second copper foil 60 and the two second adhesive films 70 undergo pre-opening processing, and a opening area 101 is formed on the semi-finished product of the rigid-flex circuit board 100, and the opening area 101 is located in a position where the dry film covered the metal protective layer 23.

In the present embodiment, the pre-opening processing of the second copper foils 60 and the two second adhesive films 70 is done by press forming. In other embodiments, the pre-opening processing may be done by other means such as mechanical drilling, laser, and the like.

In this embodiment, the material of the second adhesive film 70 is a resin having viscosity. More specifically, the resin may be at least one selected from the group consisting of polypropylene, epoxy resin, polyurethane, phenolic resin, urea resin, melamine-formaldehyde resin, and polyimide and the like.

Figure 7:
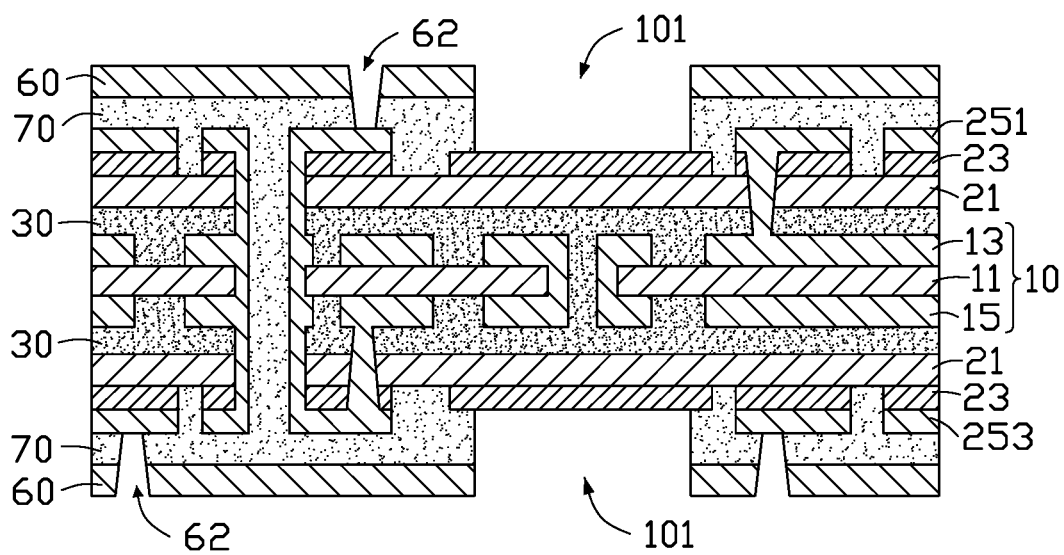
FIG. 7 is a cross-sectional view showing the opening in the semi-finished product of the rigid-flex circuit board shown in FIG. 6.

Step S7, referring to FIG. 7, the semi-finished product of the rigid-flex circuit board 100 is subjected to an opening process, and a second receiving hole 62 is formed in the second copper foil 60, and shadow processing is performed on the semi-finished product of the rigid-flex circuit board 100. The second receiving hole 62 is a blind hole extending through the second copper foil 60 and the second adhesive film 70.

In the present embodiment, the second receiving hole 62 is formed by laser. In other embodiments, the second receiving hole 62 can be formed by other means such as mechanical drilling, stamping, and the like.

When the shadow process is performed on the semi-finished product of the hard-and-soft bonded circuit board 100, carbon is applied to an outer side of the metal protective layer 23.

Figure 8:
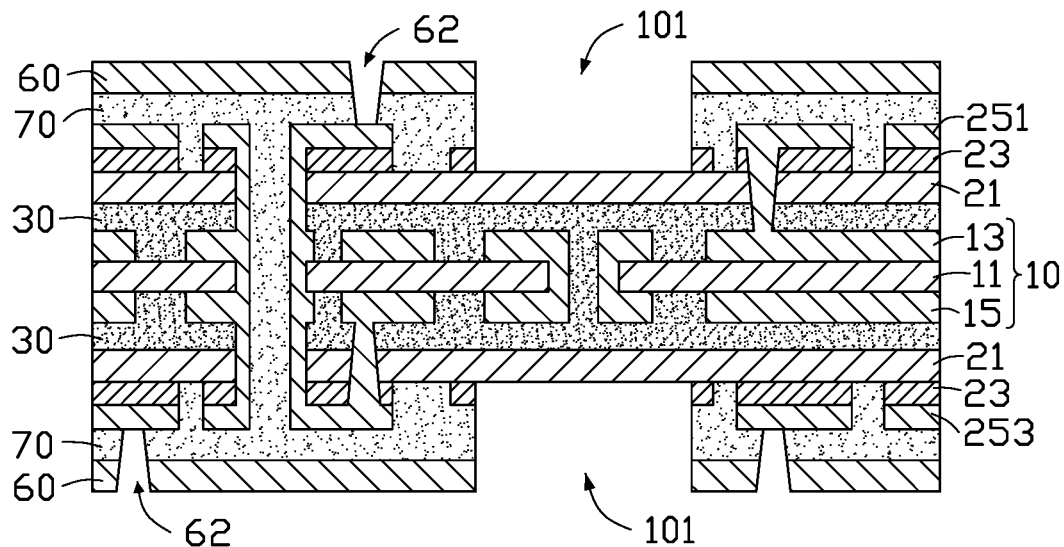
FIG. 8 is a cross-sectional view showing the removal of the metal protective layer at the opening area of the semi-finished product of the rigid-flex circuit board shown in FIG. 7.

Step S8, referring to FIG. 8, the metal protective layer 23 at the opening area 101 is removed.

The metal protective layer 23 of the opening area 101 is removed after pressing, and therefore, there is a feature in the structure that an edge of the opening area 101 has the metal protective layer 23 to distinguish it from other circuit boards, such as removing the metal protective layer before pressing.

In the present embodiment, the metal protective layer 23 is removed by etching. In other embodiments, the metal protective layer 23 can be removed by other means such as laser, mechanical stripping, and the like.

Figure 9:
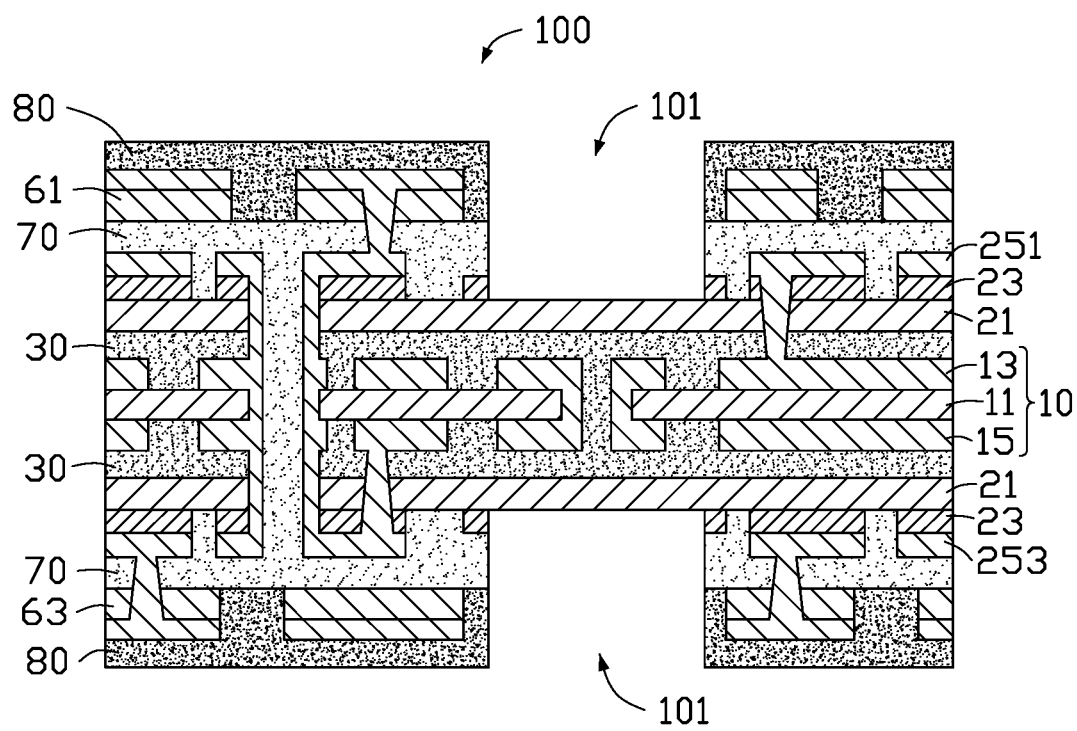
FIG. 9 is a cross-sectional view showing the rigid-flex circuit board formed by electroplating, etching, developing, stripping, and printing solder mask processes on the surface of the semi-finished product of the rigid-flex circuit board shown in FIG. 8.

Step S9, referring to FIG. 9, electroplating, etching, laminating, exposing, stripping processes (Developing Etching Stripping, DES) and solder resist printing processes are performed on the semi-finished product of the rigid-flex circuit board 100, so that the two second copper foils 60 form a fifth conductive circuit layer 61 and a sixth conductive circuit layer 63, the fifth conductive circuit layer 61 and the sixth conductive circuit layer 63 respectively electrically connected to the third conductive circuit layer 251 or the fourth conductive circuit layer 253, and a metal protective layer 80 formed outside the fifth conductive circuit layer 61 and the sixth conductive circuit layer 63.

In this embodiment, the metal protective layer 80 can be a solder mask or a cover layer (CVL) commonly used in the industry.

Referring to FIG. 9, a preferred embodiment of the present invention further provides a rigid-flex circuit board 100 including a inner flexible circuit board 10, two first flexible metal clad laminates 20 respectively bonded to two surfaces of the inner flexible circuit board 10 by two first adhesive films 30, a fifth conductive circuit layer 61 and a sixth conductive circuit layer 63 respectively bonded to an outer side of a corresponding one of the first flexible metal clad laminates 20 by two second adhesive films 70, and a metal protective layer 80 covered on an outer side of the circuit board 100.

The inner flexible circuit board 10 includes a flexible first base layer 11 and a first conductive circuit layer 13 and a second conductive circuit layer 15 respectively formed on opposite surfaces of the first base layer 11 and electrically connected together.

The first flexible metal clad laminate 20 includes a flexible second base material layer 21 laminated against the surface of the first adhesive film 30, a metal protective layer 23 formed on the surface of the second base material layer 21, and a third conductive circuit layer 251 and a fourth conductive circuit layer 253 formed on the surface of the metal protective layer 23.

The first conductive circuit layer 13, the second conductive circuit layer 15, the third conductive circuit layer 251, and the fourth conductive circuit layer 253 are electrically connected to each other, and the third conductive circuit layer 251 and the fourth conductive circuit layer 253 are respectively electrically connected to the first conductive circuit layer 13 or the second conductive circuit layer 15, and the fifth conductive circuit layer 61 and the sixth conductive circuit layer 63 are respectively electrically connected to the third conductive circuit layer 251 or the fourth conductive circuit layer 253.

The rigid-flex circuit board 100 includes a opening area 101. The metal protective layer 23, the third conductive circuit layer 251, the fourth conductive circuit layer 253, the second adhesive film 70, the fifth conductive circuit layer 61, and the sixth conductive circuit layer 63 located at the window opening region 101 are removed, and the edge of the window opening 101 is surrounded by the metal protective layer 23.

The rigid-flex circuit board 100 provided by the present invention protects the second base material layer 21 at the opening area 101 by the metal protective layer 23 during the shadow processing, and then removes the metal protective layer 23, so that the second base material layer 21 is intact, which can solve the bad issues of carbon and copper causing damage on the second base material layer 21 after shadow processing, and the circuit layer at the opening area 101 can be effectively protected. Simultaneously, the metal protective layer 21 serves as a seed layer, which can enhance a copper effect of the first copper layer 25 on the second base material layer 21. Compared with the traditional applying the cover layer (CVL) in the open cover area and then removing, it reduces processes and improves efficiency.

The above is only a preferred embodiment of the present invention, and is not intended to limit the scope of the present invention, although the present invention has been described above, and is not intended to limit the present invention. The present invention may be modified or modified to equivalent variations without departing from the technical scope of the present invention by any person skilled in the art. Any simple modifications, equivalent changes and modifications made to the above embodiments are still within the scope of the technical solutions of the present invention.

What is claimed is:

1. A method for manufacturing a rigid-flex circuit board, comprising the following steps:

providing an inner flexible circuit board and a first flexible metal clad laminate, and laminating the first flexible metal clad laminate on a surface of the inner flexible circuit board through a first adhesive film, wherein the first flexible metal clad laminate comprises a second base material layer laminated on a surface of the first adhesive film, a metal protective layer formed on a surface of the second base material layer, and a first copper layer formed on a surface of the metal protective layer, wherein the metal protective layer serves as a seed layer, which enhances a copper effect of the first copper layer on the second base material layer;

etching the first copper layer to form a third conductive circuit layer, wherein a portion of the metal protective layer is exposed by the third conductive circuit layer;

partially covering the metal protective layer exposed by the third conductive circuit layer, and removing the metal protective layer exposed by the third conductive circuit layer and the covered area;

providing a second copper foil, and laminating the second copper foil on a surface of the third conductive circuit layer through a second adhesive film, wherein the second copper foil and the second adhesive film go through a pre-opening processing to form an opening area, the opening area located at the remaining metal protective layer;

removing the metal protective layer at the opening area, wherein an edge of the opening area has the metal protective layer; and etching the second copper foil to form a fifth conductive circuit layer.

2. The method for manufacturing a rigid-flex circuit board according to claim 1, wherein causing the first copper layer to form a third conductive circuit layer comprises: performing an opening process on the inner flexible circuit board and the laminated first base material layer, opening a first through hole and a plurality of first receiving holes in the first flexible metal clad laminate, the first through hole penetrating through the two first flexible metal clad laminates, the two first adhesive films, and the inner flexible circuit board, the first receiving hole penetrating the first flexible metal clad laminate and the first adhesive film and exposing the inner flexible circuit board; performing electroplating and etching processes on the first flexible metal clad laminate, so that the first copper layer on the first flexible metal clad laminate is etched to form a third conductive circuit layer, and the inner flexible circuit board and the third conductive circuit layer are electrically connected to each other.

3. The method for manufacturing a rigid-flex circuit board according to claim 1, wherein before the step of removing the metal protective layer at the opening area, the method further comprises: performing an opening process, a second receiving hole is formed in the second copper foil, the second receiving hole penetrates the second copper foil and the second adhesive film; and then a shadow processing is performed on the structure obtained in the previous step.

4. The method for manufacturing a rigid-flex circuit board according to claim 1, wherein the inner flexible circuit board comprises a first base material layer and a first conductive circuit layer and a second conductive circuit layer formed on opposite surfaces of the first base material layer and electrically connected together.

5. The method for manufacturing a rigid-flex circuit board according to claim 1, wherein the metal protective layer exposed by the third conductive circuit layer is partially covered, removing the metal protective layer exposed by the third conductive circuit layer and the covered area comprises: partially covering the metal protective layer exposed by the third conductive circuit layer with a dry film, removing the metal protective layer exposed by the third conductive circuit layer and the covered area, and removing the dry film.

6. The method for manufacturing a rigid-flex circuit board according to claim 1, wherein the material of the metal protective layer is selected from one of Ni, Cr, Ti, Cu, Ag, Al, Zn, Sn, and Fe.

* * * * *